United States Patent
Yeh

(10) Patent No.: US 10,629,454 B2
(45) Date of Patent: Apr. 21, 2020

(54) SEMICONDUCTOR PACKAGE DEVICE AND METHOD OF MANUFACTURING THE SAME

(71) Applicant: Advanced Semiconductor Engineering, Inc., Kaohsiung (TW)

(72) Inventor: Chang-Lin Yeh, Kaohsiung (TW)

(73) Assignee: ADVANCED SEMICONDUCTOR ENGINEERING, INC., Kaohsiung (TW)

(*) Notice: Subject to any disclaimer, the term of this patent is extended or adjusted under 35 U.S.C. 154(b) by 0 days.

(21) Appl. No.: 15/807,266

(22) Filed: Nov. 8, 2017

(65) Prior Publication Data
US 2019/0139786 A1    May 9, 2019

(51) Int. Cl.
*H01L 23/48* (2006.01)
*H01L 21/56* (2006.01)
(Continued)

(52) U.S. Cl.
CPC ...... *H01L 21/563* (2013.01); *H01L 23/49833* (2013.01); *H01L 24/17* (2013.01); *H01L 24/33* (2013.01); *H01L 24/81* (2013.01); *H01L 24/13* (2013.01); *H01L 24/16* (2013.01); *H01L 24/32* (2013.01); *H01L 24/48* (2013.01); *H01L 24/73* (2013.01); *H01L 24/92* (2013.01); *H01L 24/97* (2013.01); *H01L 25/0652* (2013.01); *H01L 25/0655* (2013.01); *H01L 25/0657* (2013.01); *H01L 25/50* (2013.01); *H01L 2224/0401* (2013.01); *H01L 2224/04042* (2013.01); *H01L 2224/131* (2013.01); *H01L 2224/13147* (2013.01); *H01L 2224/16227* (2013.01); *H01L 2224/26175* (2013.01); *H01L 2224/32225* (2013.01); *H01L 2224/48227* (2013.01); *H01L 2224/73204* (2013.01); *H01L 2224/92125* (2013.01); *H01L 2224/97* (2013.01); *H01L 2225/06517* (2013.01); *H01L 2225/06572* (2013.01); *H01L 2924/14* (2013.01); *H01L 2924/15192* (2013.01); *H01L 2924/15311* (2013.01); *H01L 2924/15321* (2013.01); *H01L 2924/19041* (2013.01);
(Continued)

(58) Field of Classification Search
CPC ....... H01L 2924/00014; H01L 2924/00; H01L 2224/32225; H01L 2224/73204; H01L 2924/15311; H01L 2924/014
See application file for complete search history.

(56) References Cited

U.S. PATENT DOCUMENTS 6,940,182 B2    9/2005   Hilton et al.
8,633,598 B1 *  1/2014   St. Amand .......... H01L 23/3135
                                                    257/778
(Continued)

FOREIGN PATENT DOCUMENTS

TW           I380384 B       12/2012

*Primary Examiner* — Jaehwan Oh
(74) *Attorney, Agent, or Firm* — Foley & Lardner LLP

(57) ABSTRACT

In one or more embodiments, a semiconductor package device includes a substrate, a trace, a structure, a barrier element and an underfill. The substrate has a first surface including a filling region surrounded by the trace. The structure is disposed over the filling region and electrically connected to the substrate. The barrier element is disposed on the trace. The underfill is disposed on the filling region.

23 Claims, 23 Drawing Sheets

(51) Int. Cl.
*H01L 23/00* (2006.01)
*H01L 23/498* (2006.01)
*H01L 25/065* (2006.01)
*H01L 25/00* (2006.01)

(52) U.S. Cl.
CPC ............... *H01L 2924/19042* (2013.01); *H01L 2924/19043* (2013.01); *H01L 2924/19105* (2013.01)

(56) References Cited

U.S. PATENT DOCUMENTS

| | | | |
|---|---|---|---|
| 8,901,718 B2 | 12/2014 | Cho | |
| 2012/0126395 A1* | 5/2012 | Lee | H01L 23/3121 257/737 |
| 2015/0155243 A1* | 6/2015 | Chen | H01L 21/565 257/724 |
| 2016/0079135 A1* | 3/2016 | Huang | H01L 23/49827 257/777 |
| 2016/0247767 A1* | 8/2016 | Kim | H01L 23/49811 |

* cited by examiner

SEMICONDUCTOR PACKAGE DEVICE AND METHOD OF MANUFACTURING THE SAME

BACKGROUND

1. Technical Field

The present disclosure relates generally to a semiconductor package device and a method of manufacturing the same, and to a semiconductor package device including a stacking structure and a method of manufacturing the same.

2. Description of the Related Art

In a stacked semiconductor package device (which may include an upper substrate, a lower substrate and an interposer), an underfill can be applied around electrical contacts for protection. However, due to hydrophilicity of the substrate corresponding to the underfill (e.g. the substrate or a substance on the substrate may exert an attractive force on the underfill), the underfill may bleed out or overflow to cover other electrical contacts, which can have an impact on the electrical characteristic of the semiconductor package device. In addition, the overflowing underfill may occupy a space which is supposed to accommodate other components on the substrate, and thus an extra space may be provided, which can increase a size of the semiconductor package device.

SUMMARY

In one or more embodiments, a semiconductor package device includes a substrate, a trace, a structure, a barrier element, and an underfill. The substrate has a first surface including a filling region surrounded by the trace. The structure is disposed over the filling region and electrically connected to the substrate. The barrier element is disposed on the trace. The underfill is disposed on the filling region.

In one or more embodiments, a semiconductor package device includes a substrate, a trace, a structure, a barrier element and an underfill. The substrate has a first surface including a filling region surrounded by the trace, and a non-filling region separated from the filling region. The structure is disposed over the substrate and electrically connected to the substrate. The barrier element is disposed on the trace. The underfill is disposed on the filling region. At least a portion of the barrier element protrudes beyond a surface of the structure facing the first surface of the substrate.

In one or more embodiments, a method of manufacturing a semiconductor package device includes (a) providing a substrate having a first surface, the first surface including a filling region, the substrate including a trace disposed on the first surface adjacent to the filling region, and a pad disposed on the filling region; (b) depositing a soldering material on the trace and the pad in a common operation to form a barrier element on the trace and an electrical contact on the pad; (c) disposing a structure over the filling region, the structure electrically connected to the substrate; and (d) applying an underfill to the filling region.

BRIEF DESCRIPTION OF THE DRAWINGS

Common reference numerals are used throughout the drawings and the detailed description to indicate the same or similar elements. The present disclosure will be readily understood from the following detailed description taken in conjunction with the accompanying drawings.

DETAILED DESCRIPTION

Figure 1A:
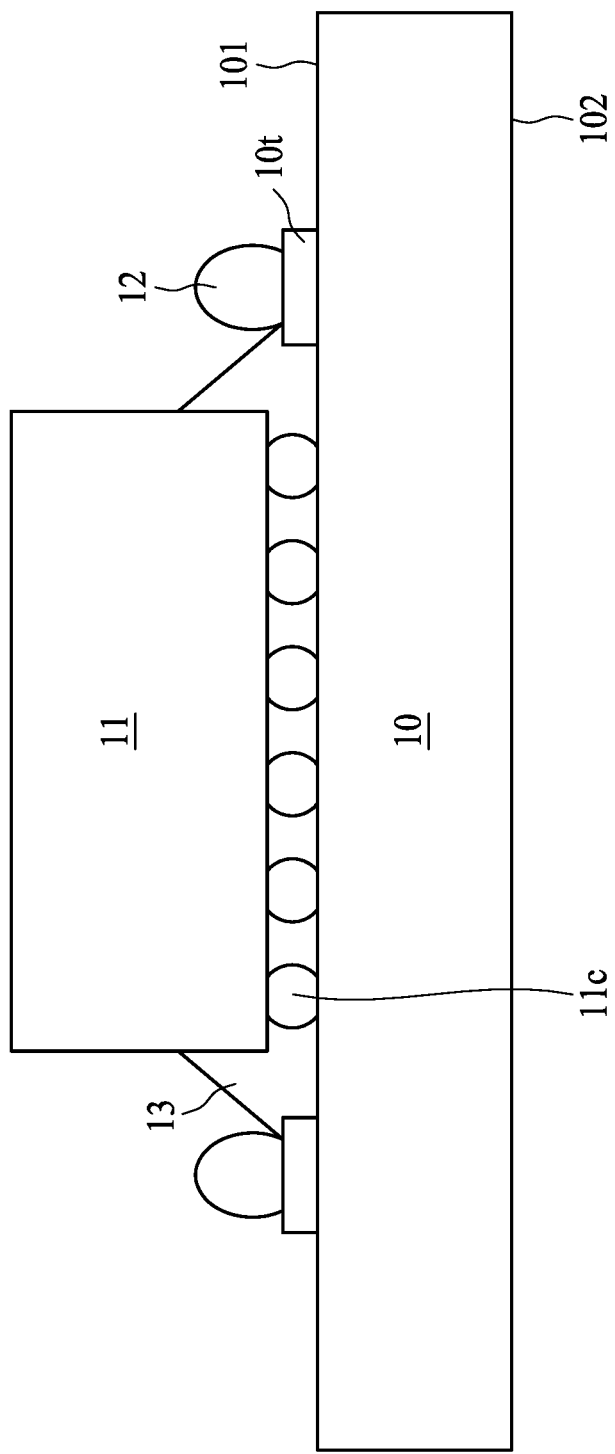
FIG. 1A illustrates a cross-sectional view of a semiconductor package device in accordance with some embodiments of the present disclosure.

FIG. 1A illustrates a cross-sectional view of a semiconductor package device 1 in accordance with some embodiments of the present disclosure. The semiconductor package device 1 includes a substrate 10, an electronic component 11, a barrier element 12 and an underfill 13.

The substrate 10 may include, for example, a printed circuit board, such as a paper-based copper foil laminate, a composite copper foil laminate, or a polymer-impregnated glass-fiber-based copper foil laminate. The substrate 10 may include an interconnection structure, such as a redistribution layer (RDL). The substrate 10 can have a surface 101 and a surface 102 opposite to the first surface 101. In some embodiments, the surface 101 of the substrate 10 is referred to as a top surface or a first surface and the surface 102 of the substrate 10 is referred to as a bottom surface or a second surface.

The electronic component 11 is disposed on the top surface 101 of the substrate 10 and electrically connected to the substrate 10. The electronic component 11 may include a chip or a die including a semiconductor substrate, one or more integrated circuit devices and/or one or more overlying interconnection structures therein. The integrated circuit devices may include active devices such as transistors and/or passive devices such resistors, capacitors, inductors, or a combination thereof. In some embodiments, the electronic component 11 is electrically connected to the substrate 10 through one or more electrical contacts 11c (e.g., solder balls) by a flip-chip technique.

The underfill 13 may be disposed on the top surface 101 of the substrate 10 to cover an active surface of the electronic component 11 and the electrical contacts 11c. In some embodiments, the underfill 13 includes an epoxy resin, a molding compound (e.g., an epoxy molding compound or other molding compound), a polyimide, a phenolic compound or material, a material including a silicone dispersed therein, or a combination thereof. In some embodiments, the underfill 13 may be a capillary underfill (CUF) or a molded underfill (MUF) depending on design specifications. A portion of the top surface 101 of the substrate 10 that is covered by the underfill 13 may be referred to herein as a filling region.

The barrier element 12 is disposed on a trace 10t disposed on or adjacent to the top surface 101 of the substrate 10. In some embodiments, the trace 10t surrounds the underfill 13 or the filling region. In some embodiments, the barrier element 12 may be or may include solder or other suitable materials which may be conductive. In some embodiments, a contact angle defined by a material of the barrier element 12 and a material of the underfill 13 is equal to or greater than about 25 degrees (e.g. is equal to or greater than about 27 degrees, is equal to or greater than about 29 degrees, is equal to or greater than about 31 degrees, or greater). In some implementations, the barrier element 12 can be omitted. However, due to the hydrophilicity of the substrate 10 corresponding to the underfill 13, the underfill 13 may bleed out to cover other electrical contacts or to occupy a space that is supposed to accommodate other components on the substrate 10. In accordance with the embodiments shown in FIG. 1 of the present disclosure, by forming the barrier element 12 (e.g., a solder dam) to surround the filing region or the underfill 13, the bleeding out issue can be avoided. In addition, the barrier element 12 can be formed when forming the electrical contacts 11c. In other words, the barrier element 12 and the electrical contacts 11c can be formed in a common process using a same material (e.g., a process including printing solder), and thus an additional process can be omitted, which can reduce a manufacturing cost. In other embodiments, the electronic component 11 may be electrically connected to the substrate 10 through pillars including copper, a copper alloy, or another metal, and the barrier element 12 can be formed when forming electrical contacts of other elements (such as passive elements or active elements).

Figure 1B:
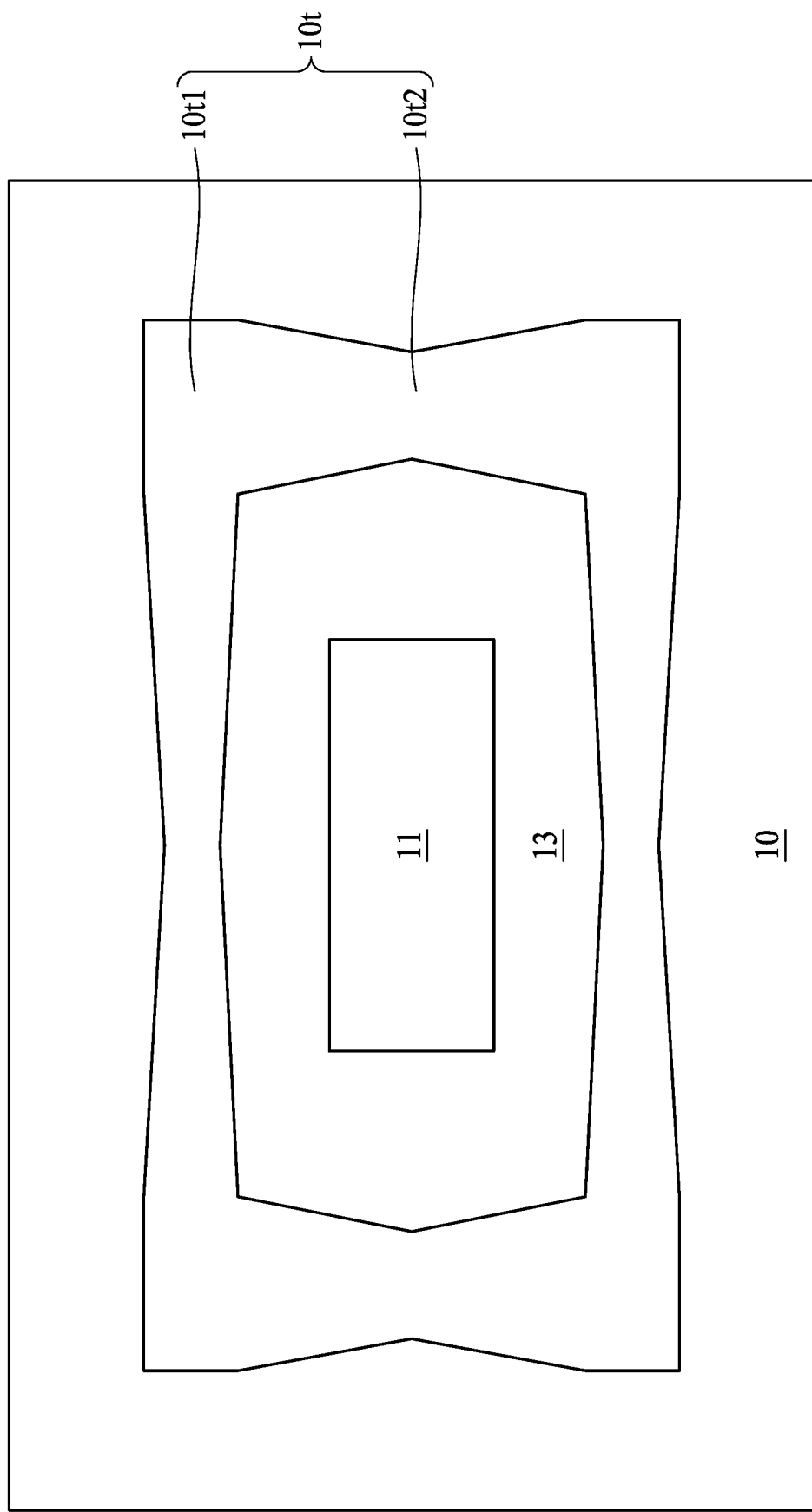
FIG. 1B illustrates a top view of a semiconductor package device in accordance with some embodiments of the present disclosure.
Figure 1C:
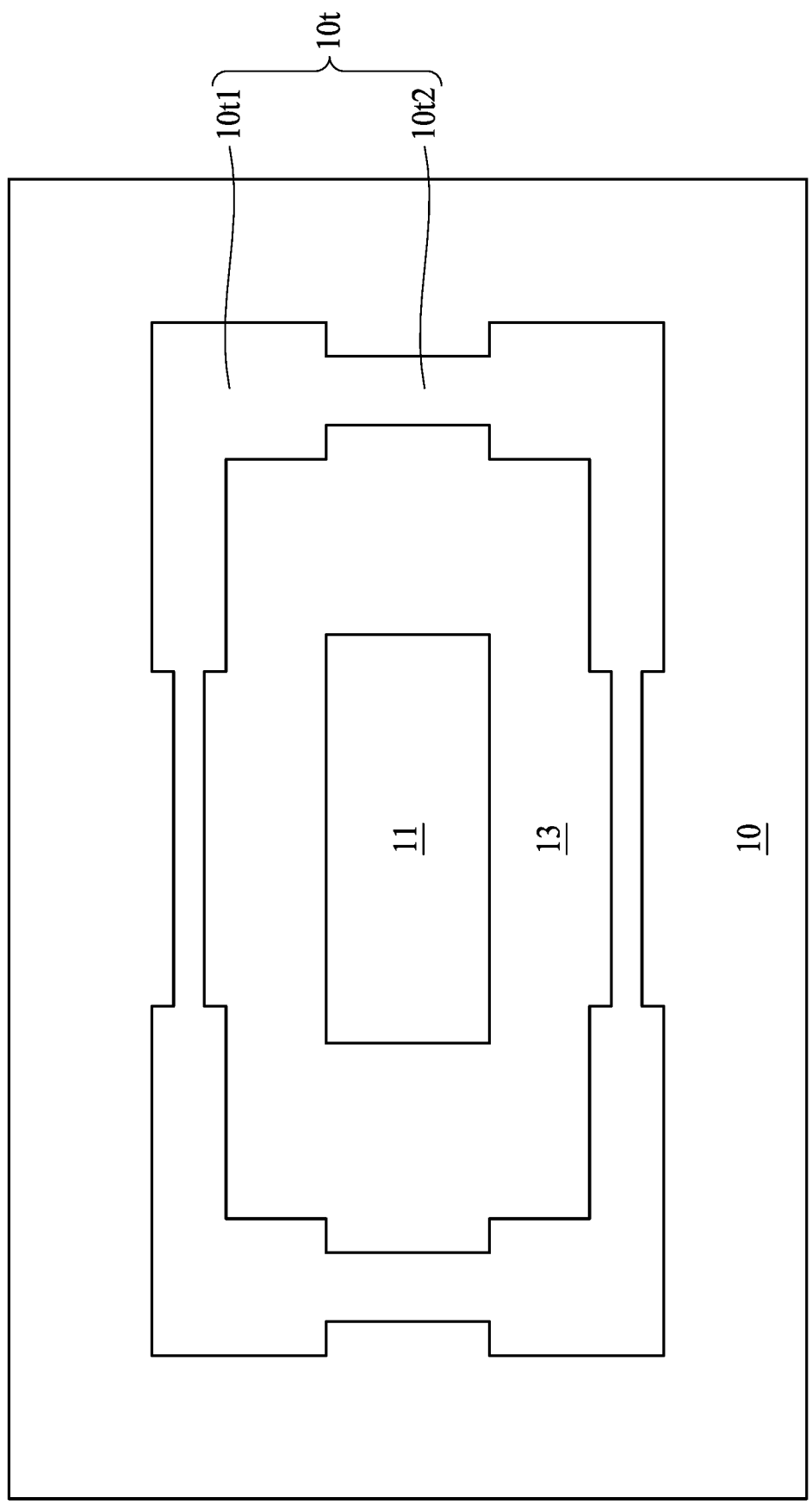
FIG. 1C illustrates a top view of a semiconductor package device in accordance with some embodiments of the present disclosure.

FIG. 1B and FIG. 1C illustrate top views of the semiconductor package device 1 shown in FIG. 1A in accordance with some embodiments of the present disclosure. As shown in FIG. 1B and FIG. 1C, the trace 10t includes a first portion 10t1 and a second portion 10t2. During the process for forming the underfill 13, the underfill 13 is injected or otherwise applied at a predetermined location (e.g., an injection region) on the top surface 101 of the substrate 10, and thus an amount of the underfill 13 at the injection region is more than that at another region. To avoid the bleeding out of the underfill 13, a width of the trace 10t at the injection region can be set to be greater than a width of the trace 10t at the other region. As shown in FIG. 1B, for example, the injection region may be located at or adjacent to the first portion 10t1 of the trace 10t, and a width of the first portion 10t1 of the trace 10t is greater than a width of the second portion 10t2 of the trace 10t, for example, at least about 1.1 times greater, at least about 1.2 times greater, or at least about 1.3 times greater. In some embodiments, a height of the barrier element 12 on the first portion 10t1 of the trace 10t is greater than a height of the barrier element 12 on the second portion 10t2 of the trace 10t (e.g. the barrier element 12 has a non-uniform height), for example, at least about 1.1 times greater, at least about 1.2 times greater, or at least about 1.3 times greater. In some embodiments, a height of the underfill 13 adjacent to the first portion 10t1 of the trace 10t is greater than a height of the underfill 13 adjacent to the second portion 10t2 of the trace 10t, for example, at least about 1.1 times greater, at least about 1.2 times greater, or at least about 1.3 times greater. In some embodiments, the trace 10t is substantially ring-shaped.

Figure 1E:
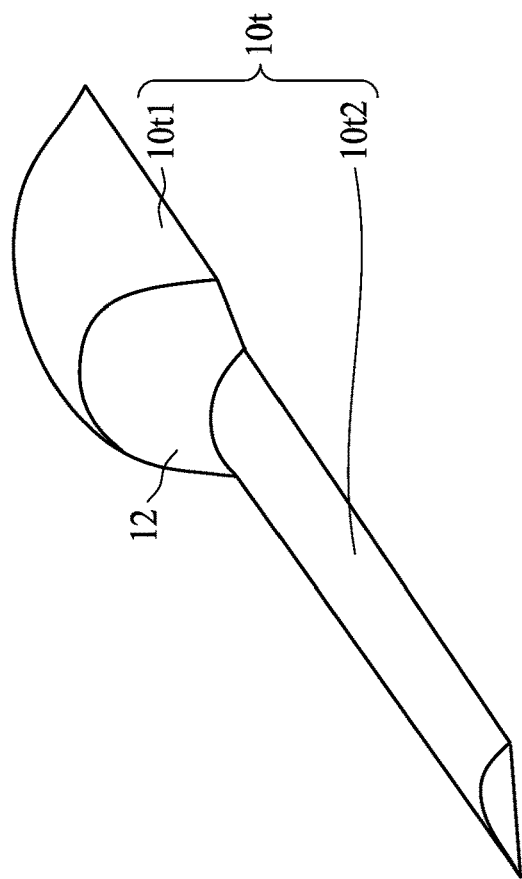
FIG. 1E illustrates a perspective view of a trace in accordance with some embodiments of the present disclosure.
Figure 1D:
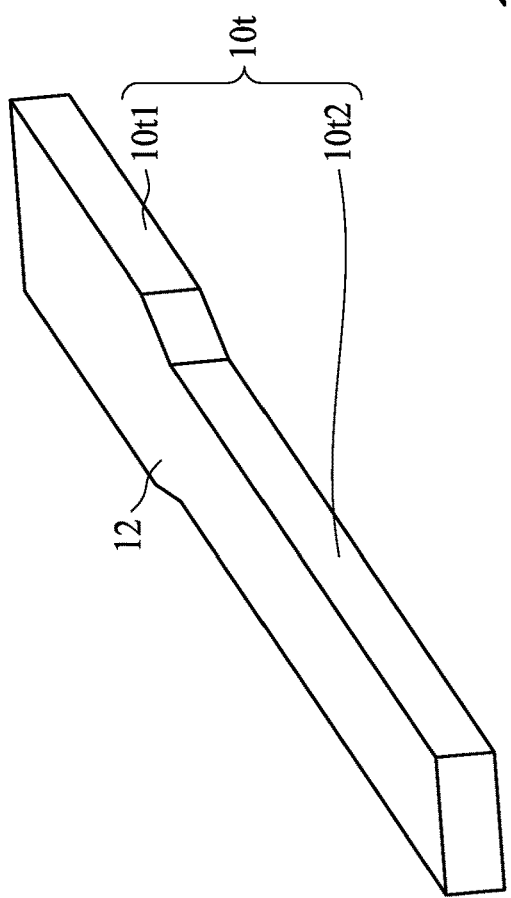
FIG. 1D illustrates a perspective view of a trace in accordance with some embodiments of the present disclosure.

FIG. 1D illustrates a perspective view of the trace 10t before a reflow process and FIG. 1E illustrates a perspective view of the trace 10t and the barrier element 12 after the reflow process in accordance with some embodiments of the present disclosure. As shown in FIG. 1D, a width of the first portion 10t1 of the trace 10t is greater than a width of the second portion 10t2 of the trace 10t, and the height of the barrier element 12 on the first portion 10t1 of the trace 10t is substantially the same as the height of the barrier element 12 on the second portion 10t2 of the trace 10t. After the reflow process, as shown in FIG. 1E, the height of the barrier element 12 on the first portion 10t1 of the trace 10t is greater than the height of the barrier element 12 on the second portion 10t2 of the trace 10t.

Figure 1F:
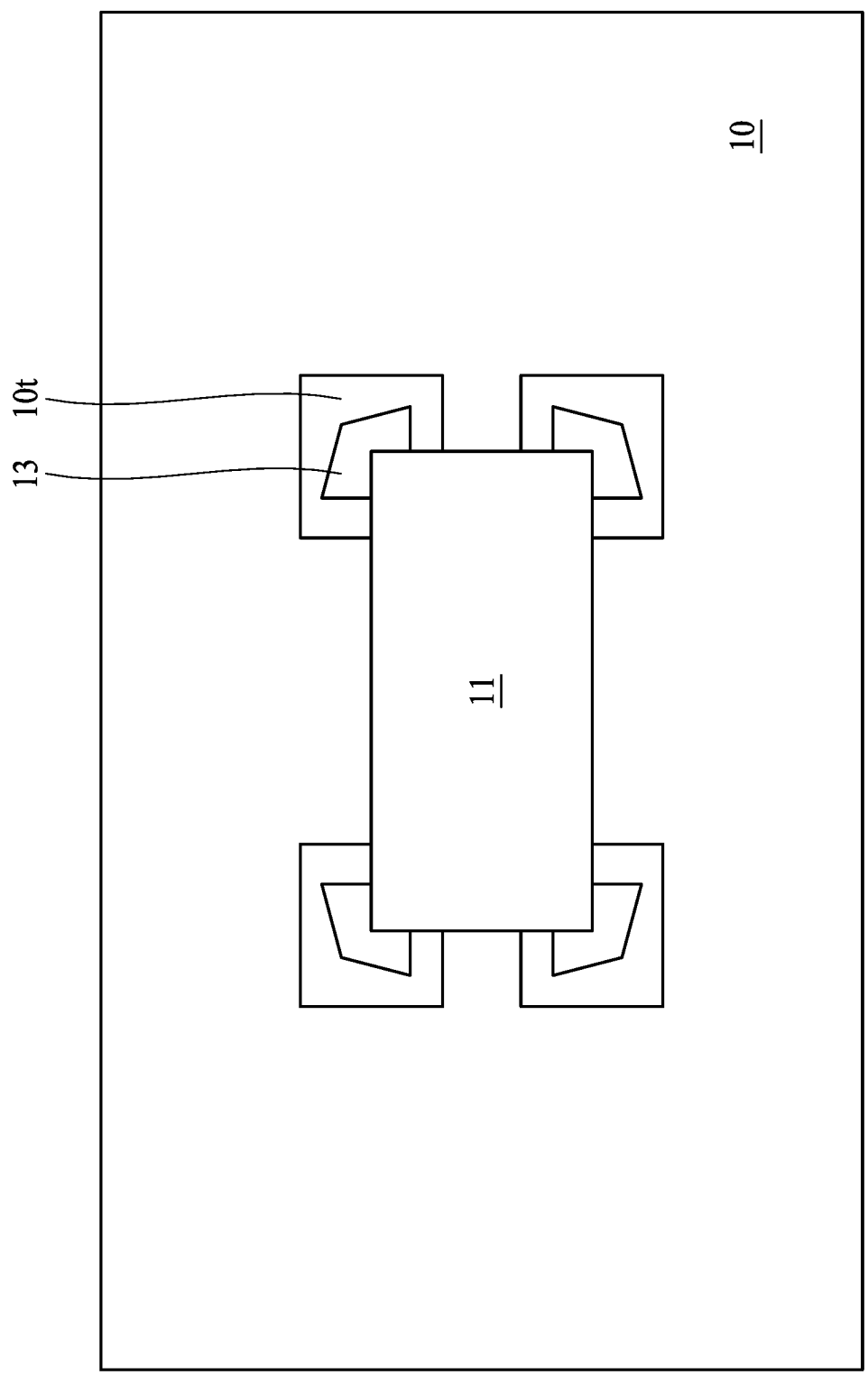
FIG. 1F illustrates a top view of a semiconductor package device in accordance with some embodiments of the present disclosure.

FIG. 1F illustrates a top view of the semiconductor package device 1 shown in FIG. 1A in accordance with some embodiments of the present disclosure. In general, stress usually occurs at corners of the electronic component 11, while a middle portion of each edge of the electronic component 11 suffers a relatively low stress. Therefore, to reduce the manufacturing cost, the underfill 13 and the trace 10t on which the barrier element 12 is disposed may be selectively formed at the corners of the electronic component 11 as shown in FIG. 1F, and forming the underfill 13 and the trace 10t at or near the middle portion of the edges of the electronic component 11 may be omitted (e.g. structures each including an underfill 13 and a trace 10t may be respectively disposed at the corners of the electronic component 11 and may be spaced apart).

Figure 2A:
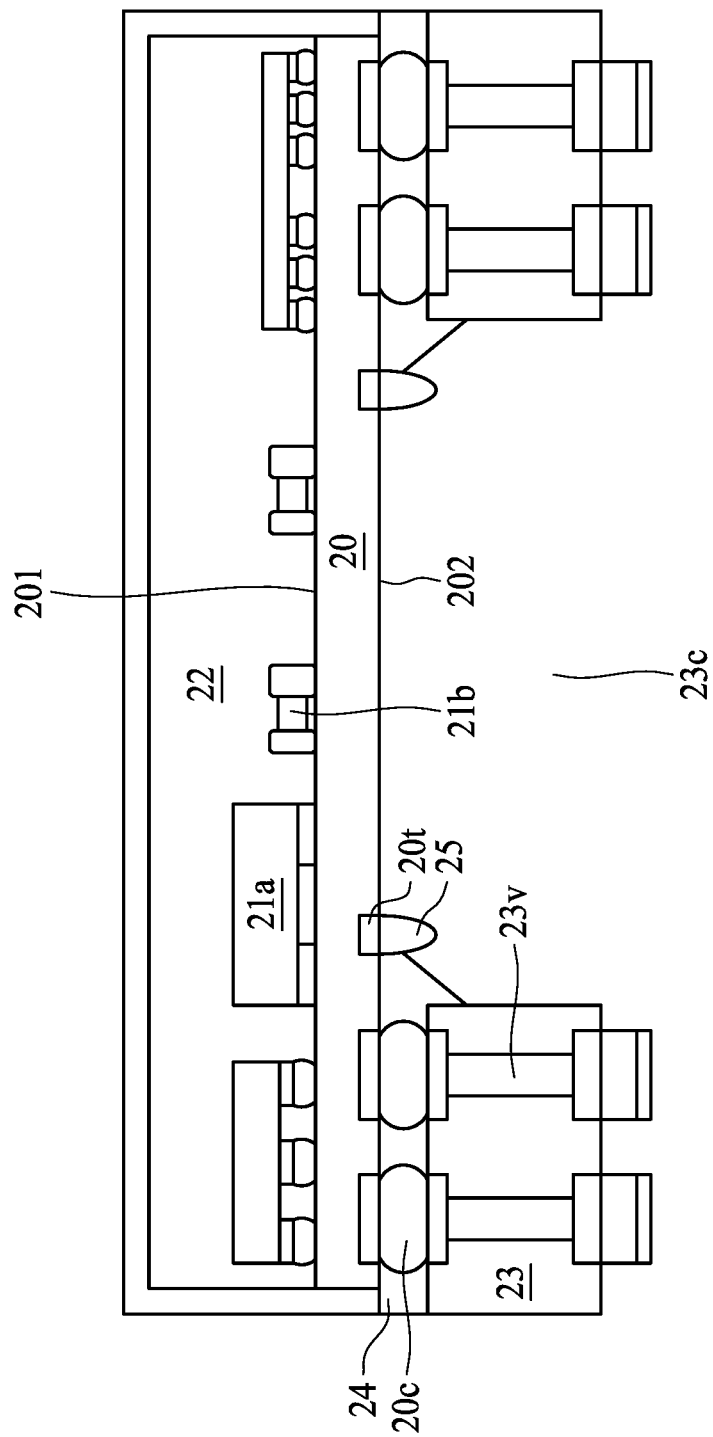
FIG. 2A illustrates a cross-sectional view of a semiconductor package device in accordance with some embodiments of the present disclosure.

FIG. 2A illustrates a cross-sectional view of a semiconductor package device 2 in accordance with some embodiments of the present disclosure. The semiconductor package device 2 includes a substrate 20, an electronic component 21a, an electronic component 21b, a package body 22, an interposer 23, an underfill 24 and a barrier element 25.

The substrate 20 may include, for example, a printed circuit board, such as a paper-based copper foil laminate, a composite copper foil laminate, or a polymer-impregnated glass-fiber-based copper foil laminate. The substrate 20 may include an interconnection structure, such as an RDL. The substrate 20 can have a surface 201 and a surface 202 opposite to the first surface 201. The surface 201 of the substrate 20 may be referred to herein as a top surface or a first surface and the surface 202 of the substrate 20 may be referred to herein as a bottom surface or a second surface.

The electrical components 21a, 22b are disposed on the top surface 201 of the substrate 20. The electrical component 21a may include an active component, such as an integrated circuit (IC) chip or a die. The electrical component 21b may include a passive electrical component, such as a capacitor, a resistor or an inductor. Each electrical component 21a, 21b may be electrically connected to one or more of another electrical component 21a, 21b or to the substrate 20 (e.g., to the RDL of the substrate 20), and electrical connection may be attained by way of flip-chip or wire-bond techniques.

The package body 22 is disposed on the top surface 201 of the substrate 20 and covers the electronic components 21a and 21b. In some embodiments, the package body 22 includes, for example, organic materials (e.g., a molding compound, bismaleimide triazine (BT), a polyimide (PI), polybenzoxazole (PBO), a solder resist, an Ajinomoto build-up film (ABF), a polypropylene (PP) or an epoxy-based material), inorganic materials (e.g., silicon, a glass, a ceramic or a quartz), liquid-film materials and/or dry-film materials, or a combination thereof.

The interposer 23 is disposed over the bottom surface 202 of the substrate 20 and electrically connected to the substrate 20 through one or more electrical contacts 20c (e.g., solder balls). The interposer 23 may include at least one interconnection in the form of a through via 23v penetrating the interposer 23 for electrical connection (e.g. to one or more external devices). Exposed traces (e.g. a trace 20t) and/or conductive pads on the bottom surface 202 of the substrate 20 can be electrically connected to the through via 23v of the interposer 23 through the electrical contacts 20c. The interposer 23 may include, for example, a printed circuit board, such as a paper-based copper foil laminate, a composite copper foil laminate, or a polymer-impregnated glass-fiber-based copper foil laminate. The interposer 23 and the electrical contacts 20c may be arranged at or near a periphery of the bottom surface 202 of the substrate 20. In some embodiments, the interposer 23 defines a cavity 23c that exposes a portion of the bottom surface 202 of the substrate, a portion of the underfill 24 and the barrier element 25. In some embodiments, the barrier element 25 may protrude beyond a surface of the interposer 23.

The underfill 24 may be disposed between the bottom surface 202 of the substrate 20 and the interposer 23 to cover the electrical contacts 20c. In some embodiments, the underfill 24 includes an epoxy resin, a molding compound (e.g., an epoxy molding compound or other molding compound), a polyimide, a phenolic compound or material, a material including a silicone dispersed therein, or a combination thereof. In some embodiments, the underfill 23 may be a CUF or a MUF depending on design specifications. A portion of the bottom surface 202 of the substrate 20 that is covered by the underfill 24 may be referred to herein as a filling region.

Figure 2B:
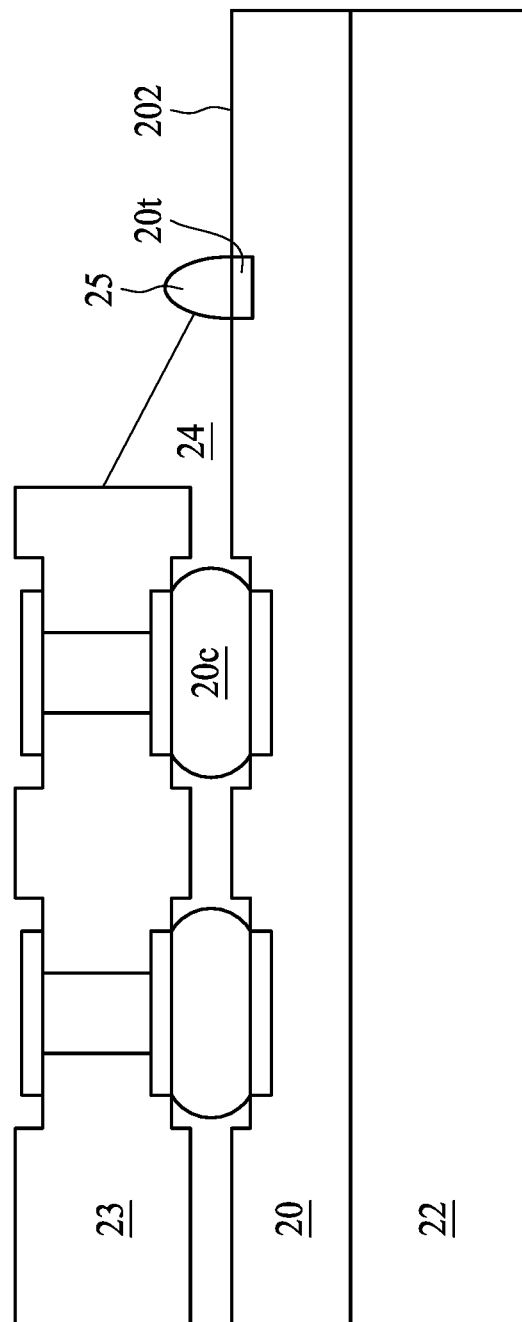
FIG. 2B illustrates an enlarged view of a portion of the semiconductor package device shown in FIG. 2A in accordance with some embodiments of the present disclosure.

The barrier element 25 is disposed on the trace 20t on the bottom surface 202 of the substrate 20 as shown in FIG. 2B, which illustrates an enlarged view of a portion of the semiconductor package device 2 shown in FIG. 2A in accordance with some embodiments of the present disclosure. In some embodiments, the barrier element 25 may be or include solder or other suitable materials which may be conductive. In some embodiments, a contact angle defined by a material of the barrier element 25 and a material of the underfill 24 is equal to or greater than about 25 degrees (e.g. is equal to or greater than about 27 degrees, is equal to or greater than about 29 degrees, is equal to or greater than about 31 degrees, or greater). In some embodiments, the barrier element 25 can be omitted. However, due to the hydrophilicity of the substrate 20 corresponding to the underfill 24, the underfill 24 may bleed out to cover other electrical contacts or to occupy a space that is supposed to accommodate other components on the substrate 20. In accordance with the embodiments shown in FIG. 2A of the present disclosure, by forming the barrier element 25 (e.g., a solder dam) to block the underfill 24, the underfill 24 can be prevented from flowing to a portion of the bottom surface 202 of the substrate 20 that is exposed by the cavity 23c of the interposer 23. Therefore, the cavity 23c of the interposer 23 can have sufficient space to accommodate additional electronic components.

Figure 2C:
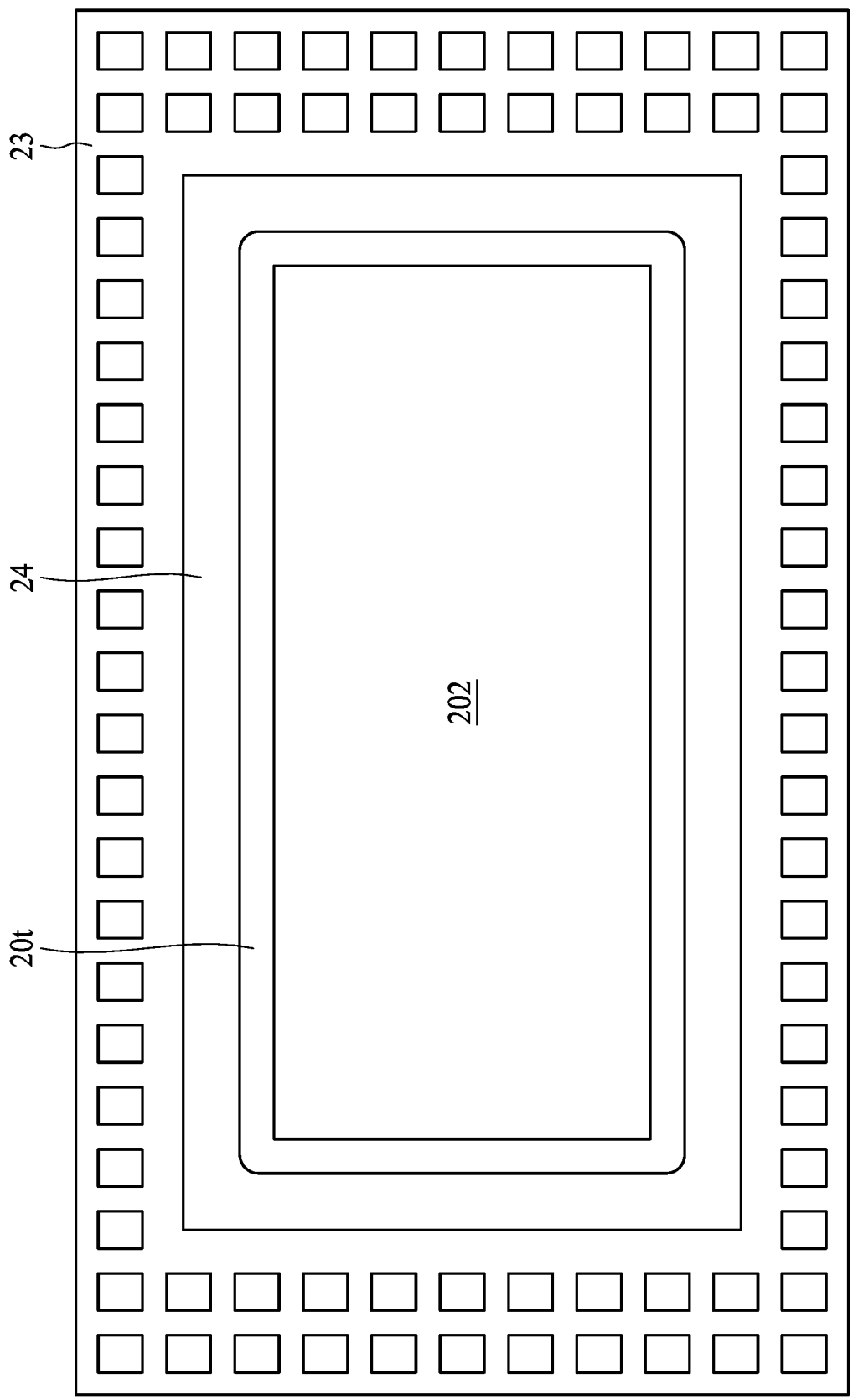
FIG. 2C illustrates a bottom view of a semiconductor package device in accordance with some embodiments of the present disclosure.

FIG. 2C illustrates a bottom view of the semiconductor package device 2 shown in FIG. 2A in accordance with some embodiments of the present disclosure. As shown in FIG. 2C, the trace 20t, on which the barrier element 25 is disposed, is disposed on the bottom surface 202 of the substrate 20 to prevent the underfill 24 from flowing to the portion of the bottom surface 202 of the substrate 20 that is exposed by the cavity 23c of the interposer 23. As shown in FIG. 2C, the trace 20t surrounds a portion of the bottom surface 202 of the substrate 20 that is exposed from the interposer 23. For example, the trace 20t is disposed on four edges of the exposed portion of the bottom surface 202 of the substrate 20. In some embodiments, the trace 20t may be selectively disposed on one, two or three edges of the exposed portion of the bottom surface 202 of the substrate 20. For example, the trace 20t may be disposed on two opposing edges of the bottom surface 202 of the substrate 20. For example, the trace 20t may be disposed on two adjacent edges of the bottom surface 202 of the substrate 20 (e.g., in an L-shape arrangement). For example, the trace 20t may be disposed on three adjacent edges of the bottom surface 202 of the substrate 20 (e.g., in a U-shape arrangement).

Figure 2D:
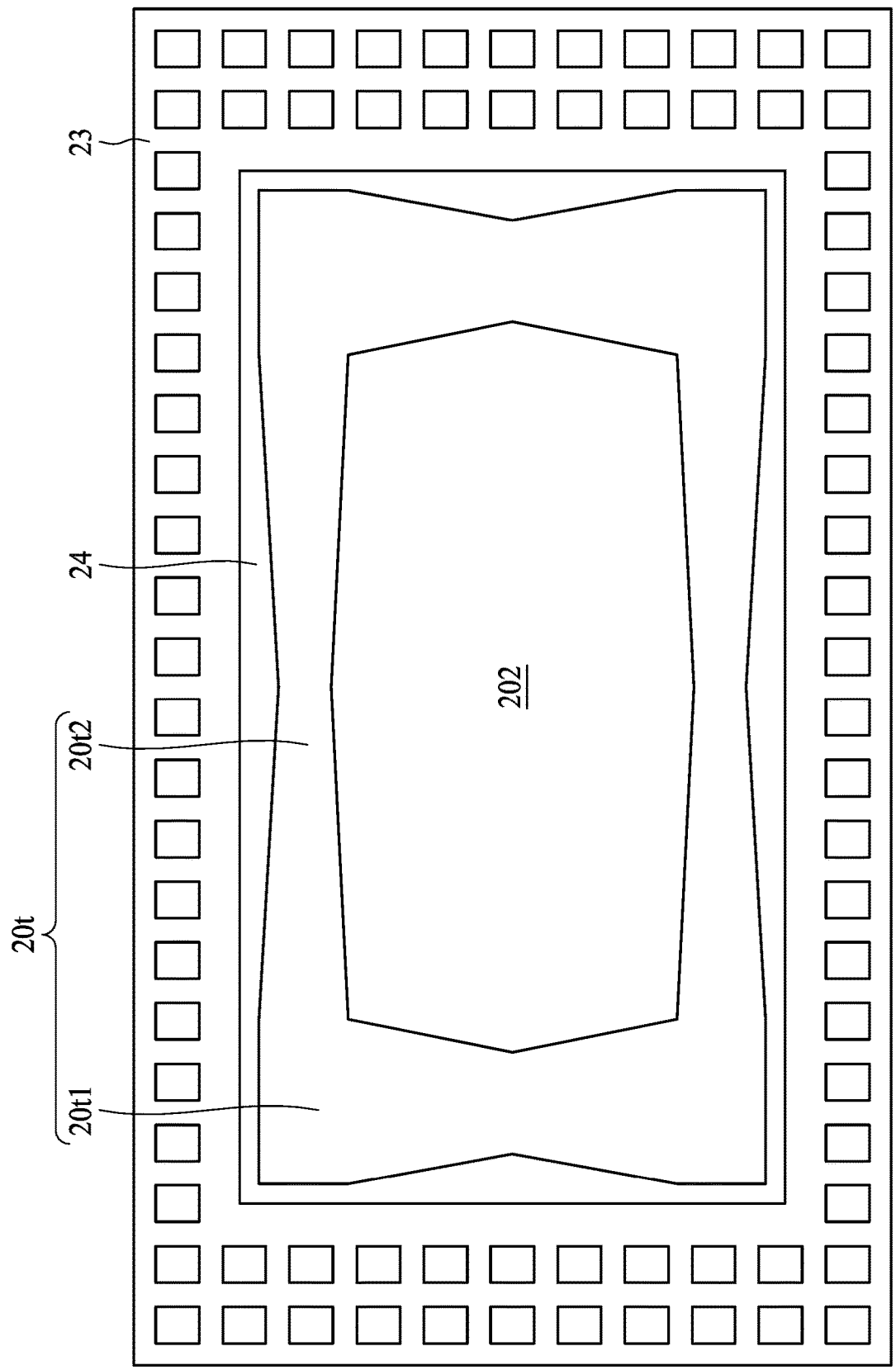
FIG. 2D illustrates a bottom view of a semiconductor package device in accordance with some embodiments of the present disclosure.
Figure 2E:
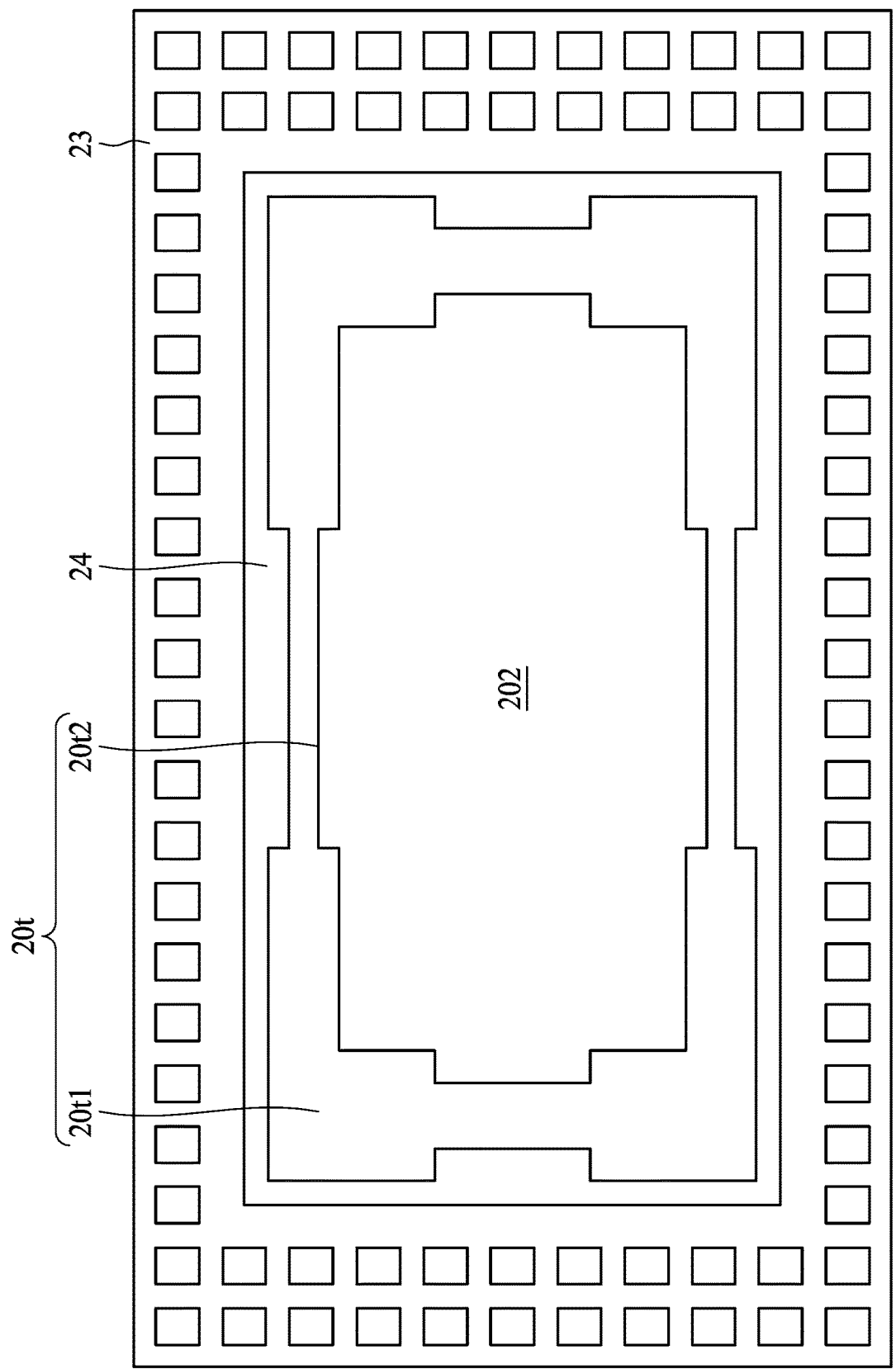
FIG. 2E illustrates a bottom view of a semiconductor package device in accordance with some embodiments of the present disclosure.

FIG. 2D and FIG. 2E illustrate bottom views of the semiconductor package device 2 shown in FIG. 2A in accordance with some embodiments of the present disclosure. The structure shown in FIG. 2D or 2E is similar to that shown in FIG. 2C, except that in FIG. 2C, a width of the trace 20t is substantially uniform while in FIG. 2D or 2E, a width of the trace 20t is non-uniform.

As shown in FIG. 2D and FIG. 2E, the trace 20t includes a first portion 20t1 and a second portion 20t2. During the process for forming the underfill 24, the underfill 24 is injected at a predetermined location (e.g., an injection region) on the bottom surface 202 of the substrate 20, and an amount of the underfill 24 at the injection region is more than that at other region. To avoid the bleeding out of the underfill 24, a width of the trace 20t at, near or adjacent to the injection region can be set to be greater than a width of the trace 20t at the other region. For example, as shown in FIG. 2D or 2E, the injection region may be located at or adjacent to the first portion 20t1 of the trace 20t, and a width of the first portion 20t1 of the trace 20t is greater than a width of the second portion 20t2 of the trace 20t, for example, at least about 1.1 times greater, at least about 1.2 times greater, or at least about 1.3 times greater. In some embodiments, a height of the barrier element 25 on the first portion 20t1 of the trace 20t is greater than a height of the barrier element 25 on the second portion 20t2 of the trace 20t, for example, at least about 1.1 times greater, at least about 1.2 times greater, or at least about 1.3 times greater. In some embodiments, a height of the underfill 24 adjacent to the first portion 20t1 of the trace 20t is greater than a height of the underfill 24 adjacent to the second portion 20t2 of the trace 20t, for example, at least about 1.1 times greater, at least about 1.2 times greater, or at least about 1.3 times greater. In some embodiments, the trace 20t is substantially ring-shaped. In some embodiments, the trace 20t is similar to the trace 10t shown in FIG. 1D and FIG. 1E.

Figure 2F:
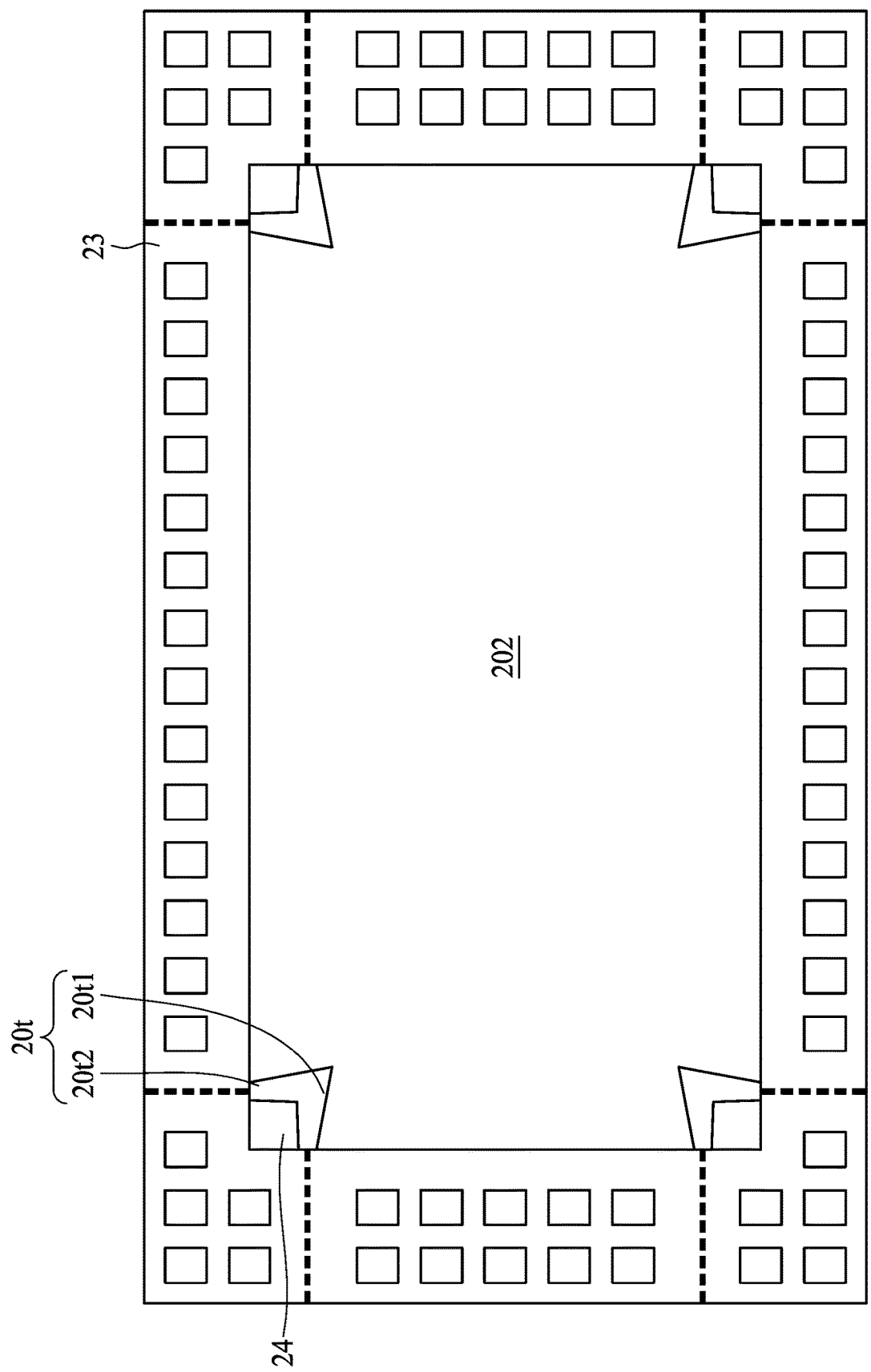
FIG. 2F illustrates a bottom view of a semiconductor package device in accordance with some embodiments of the present disclosure.

FIG. 2F illustrates a bottom view of the semiconductor package device 2 shown in FIG. 2A in accordance with some embodiments of the present disclosure. In general, stress usually occurs at corners of the substrate 20 while a middle portion of each edge of the substrate 20 suffers a relatively low stress. Therefore, to reduce manufacturing cost, the underfill 24 and the trace 20t on which the barrier element is disposed can be selectively formed at the corners of the substrate 20 as shown in FIG. 2F, and forming the underfill 24 and the trace 20t at or near the middle portion of the edges of the substrate 20 may be omitted (e.g. structures each including an underfill 23 and at least a portion of a trace 20t may be respectively disposed at the corners of the substrate 20 and may be spaced apart). As shown in FIG. 2F, the trace 20t includes a first portion 20t1 exposed from the interposer 23 and a second portion 20t2 disposed between the substrate 20 and the interposer 23. In some embodiments, at least a portion of the second portion 20t2 of the trace 20t is exposed from the interposer 23. In some embodiments, a width of the first portion 20t1 of the trace 20t is greater than a width of the second portion 20t2 of the trace 20t, for example, at least about 1.1 times greater, at least about 1.2 times greater, or at least about 1.3 times greater. In some embodiments, a height of the barrier element 25 on the first portion 20t1 of the trace 20t is greater than a height of the barrier element 25 on the second portion 20t2 of the trace 20t, for example, at least about 1.1 times greater, at least about 1.2 times greater, or at least about 1.3 times greater. In some embodiments, a height of the underfill 24 adjacent to the first portion 20t1 of the trace 20t is greater than a height of the underfill 24 adjacent to the second portion 20t2 of the trace 20t, for example, at least about 1.1 times greater, at least about 1.2 times greater, or at least about 1.3 times greater.

Figure 2H:
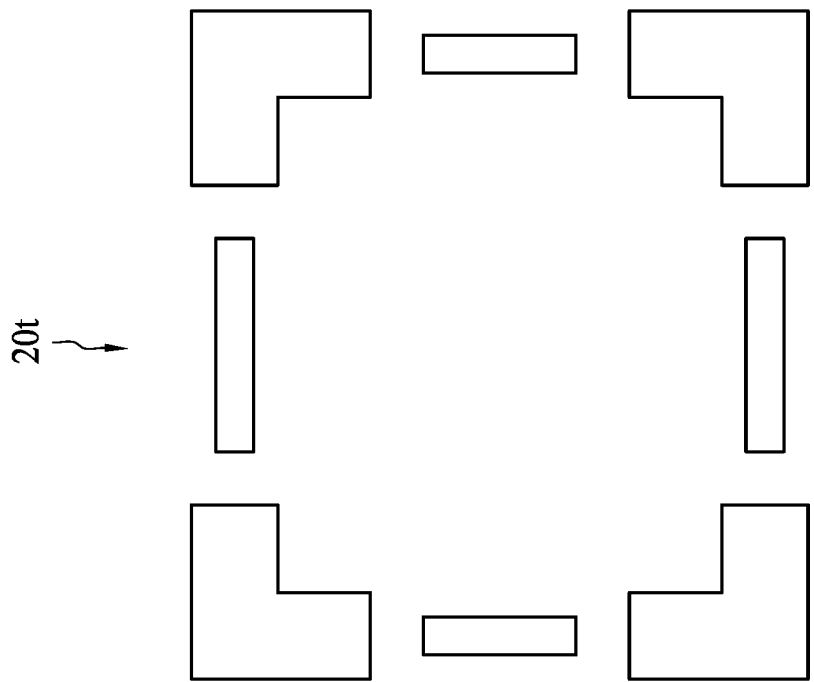
FIG. 2H illustrates a top view of a trace in accordance with some embodiments of the present disclosure.
Figure 2G:
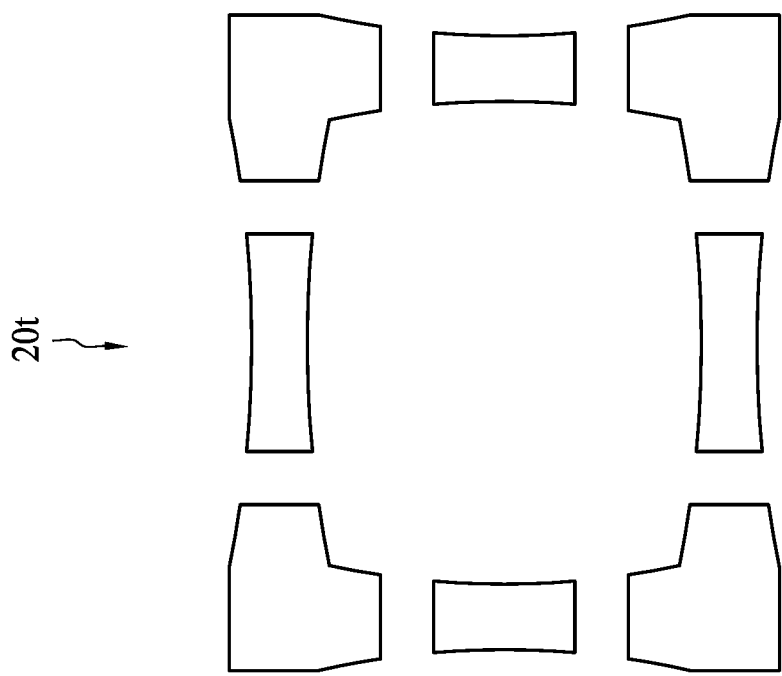
FIG. 2G illustrates a top view of a trace in accordance with some embodiments of the present disclosure.

In some embodiments, as shown in FIG. 2G and FIG. 2H, the trace 20t may include multiple sections, and each section is separated from another section. The number of the sections can be determined depending on design specifications.

Figure 3A:
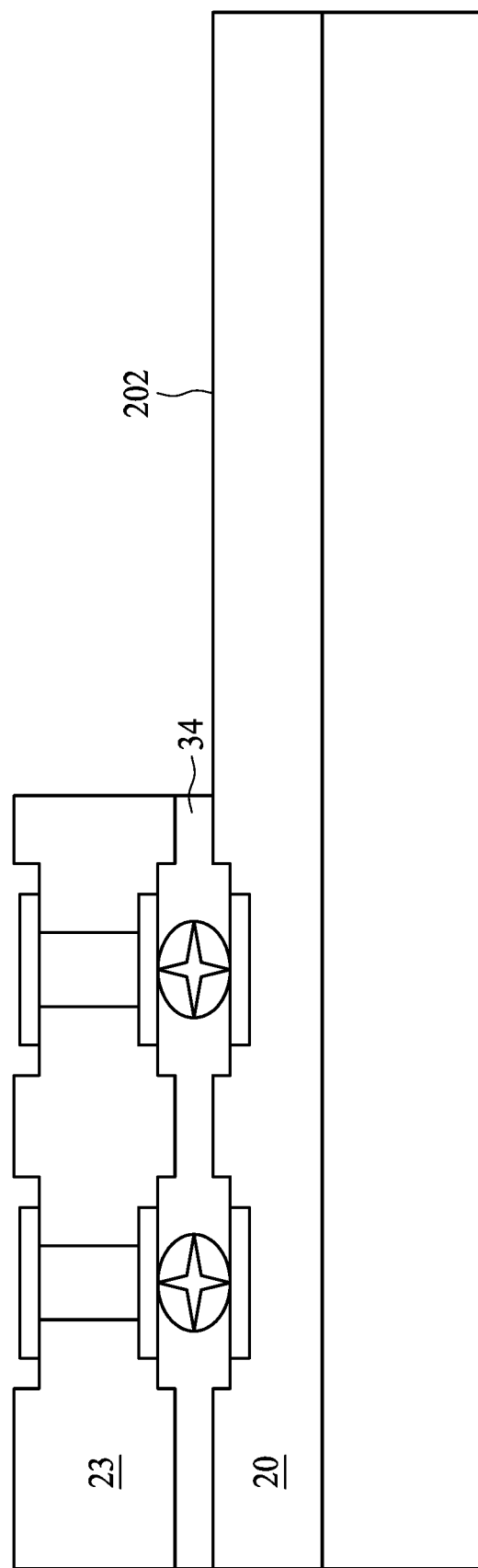
FIG. 3A illustrates a comparative semiconductor package device.

FIG. 3A illustrates a comparative semiconductor package device. The structure shown in FIG. 3A is similar to that shown in FIG. 2B, except that in FIG. 3A, the electrical contacts 20c and the underfill 24 shown in FIG. 2B are replaced by an anisotropic conductive film (ACF) 34. The ACF 34 is applied or disposed between the substrate 20 and the interposer 23 to provide electrical connections therebetween. Unlike the underfill 24, the ACF 34 may avoid the bleeding out issue. However, the ACF 34 has a relatively high resistance and cost compared to solder balls (e.g., electrical contacts 20c). In addition, the ACF 34 is formed by applying heat and pressure, which may damage the semiconductor package device if the pressure or the heat is not well-controlled.

Figure 3B:
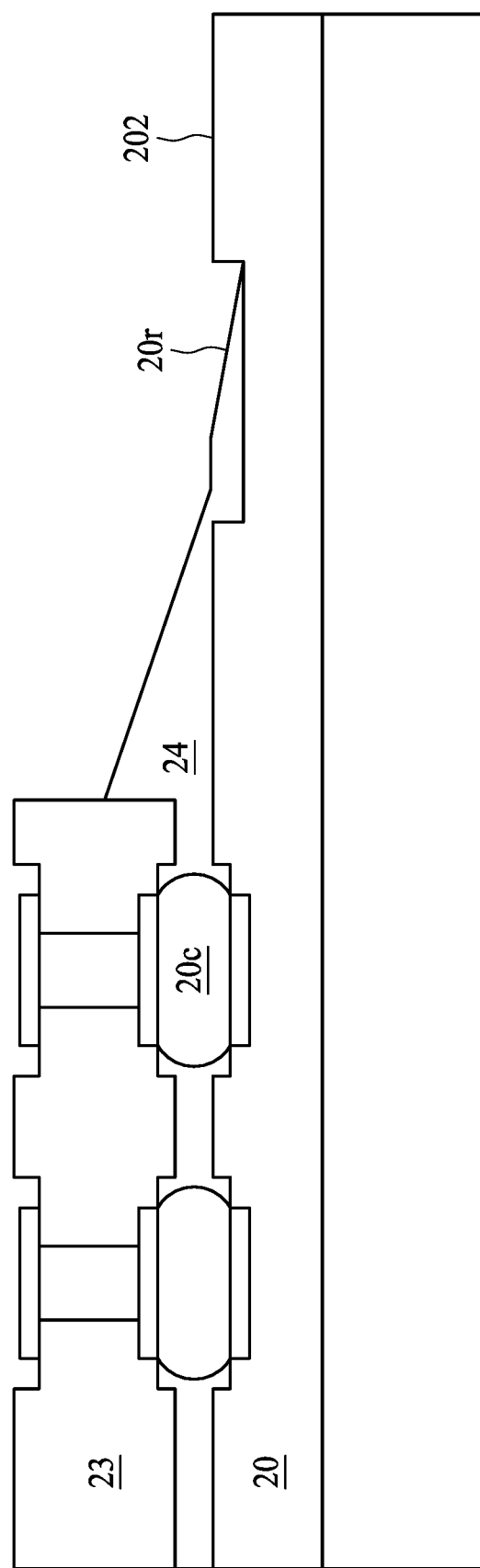
FIG. 3B illustrates a comparative semiconductor package device.

FIG. 3B illustrates a comparative semiconductor package device. The structure shown in FIG. 3B is similar to that shown in FIG. 2B, except that in FIG. 3B, the barrier element 25 is omitted. As shown in FIG. 3B, to prevent the bleeding out issue, a recess 20r is formed on the bottom surface 202 of the substrate 20 to accommodate the overflowed underfill 24. However, the depth and the width of the recess 20r may be large to accommodate the overflowed underfill 24, which can hinder the miniaturization of the semiconductor package device. In addition, the underfill 24 has a high hydrophilicity (and, for example, a contact angle of less than 25 about degrees) relative to the substrate 20 or solder resist on the substrate 20, and thus using the recess 20r to avoid the bleeding out issue is not always effective.

Figure 3C:
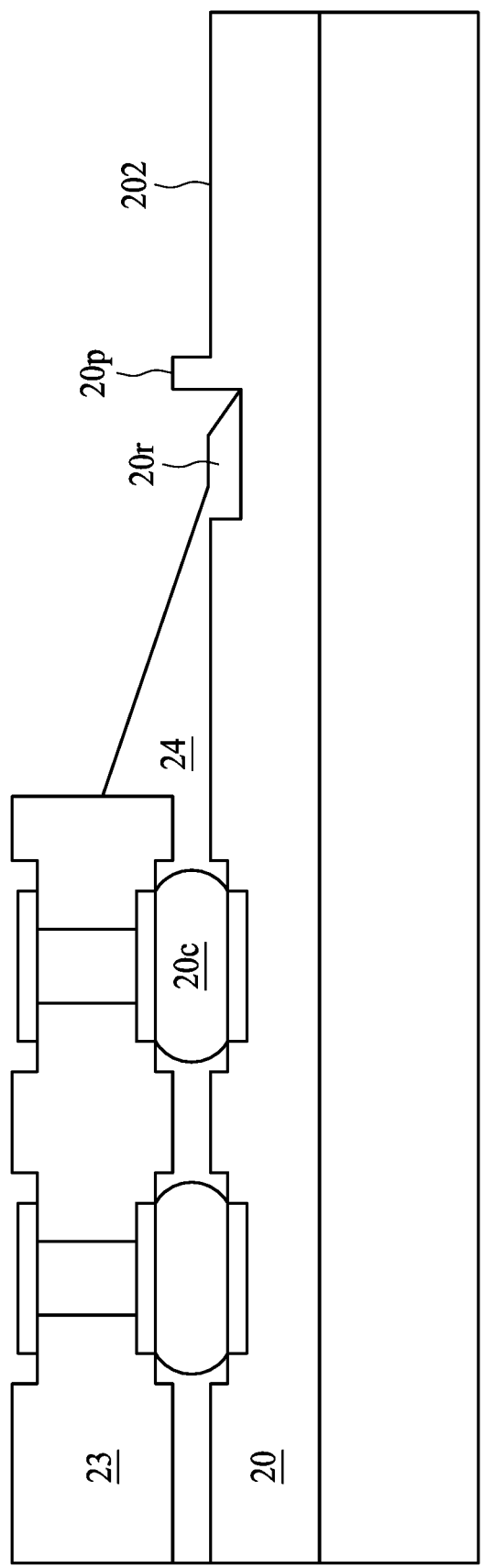
FIG. 3C illustrates a comparative semiconductor package device.

FIG. 3C illustrates a comparative semiconductor package device. The structure shown in FIG. 3C is similar to that shown in FIG. 3B, except that in FIG. 3C, the bottom surface 202 of the substrate 20 further includes a protruding portion 20p to block the overflowed underfill 24. The structure shown in FIG. 3C can be more effective at avoiding the bleeding out issue compared with the structure shown in FIG. 3B. However, it can be challenging to implement a sufficiently high protruding portion 20p of the substrate 20 or solder resist of the substrate 20.

In accordance with the embodiments shown in FIG. 2B, the barrier element 25 may include solder. Because the hydrophilicity of the underfill 24 relative to solder is relatively low (and the contact angle is equal to or greater than about 25 degrees (e.g. is equal to or greater than about 27 degrees, is equal to or greater than about 29 degrees, is equal to or greater than about 31 degrees, or greater)), the underfill 24 is less prone to overflow beyond the barrier element 25. In addition, the barrier element 25 can be formed when forming the electrical contacts 20c. In other words, the barrier element 25 and the electrical contacts 20c can be formed in a common process (e.g., by printing solder), and thus an additional process can be omitted, which can reduce the manufacturing cost.

Figure 4A:
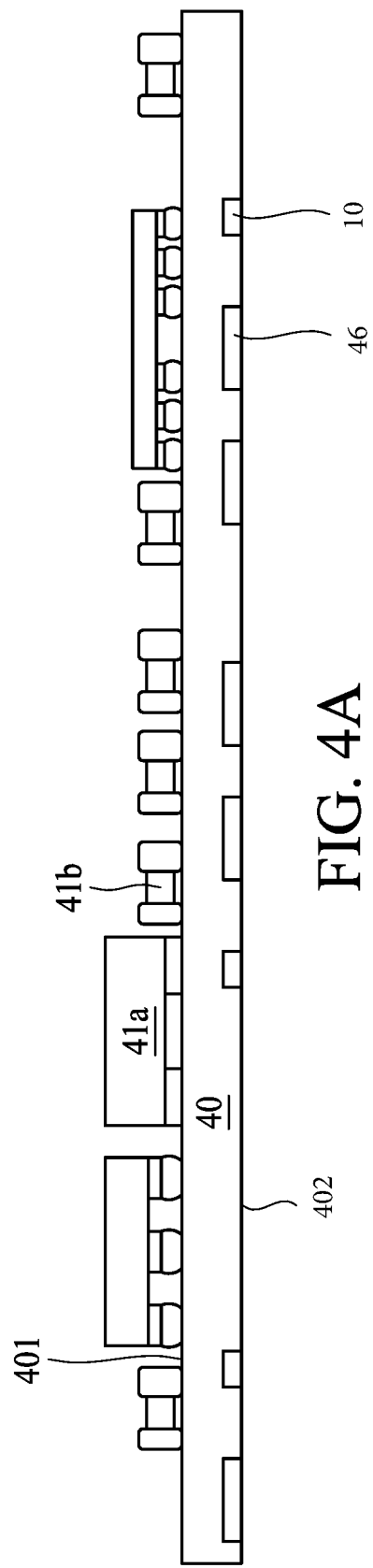
FIG. 4A, FIG. 4B, FIG. 4C, FIG. 4D, FIG. 4E, FIG. 4E'.
Figure 4B:
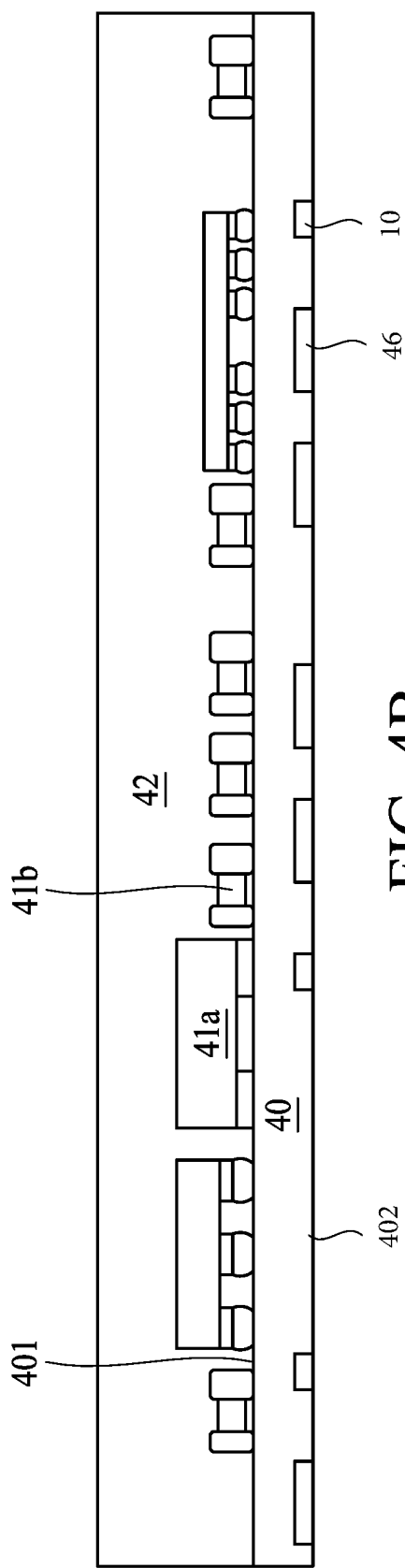
Figure 4C:
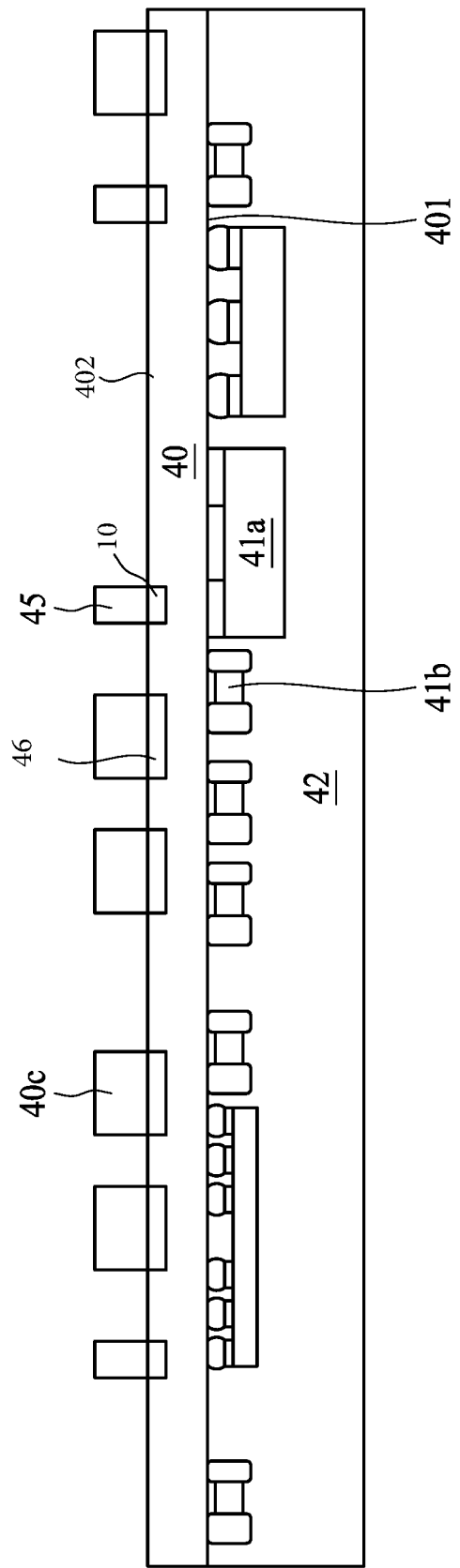
Figure 4D:
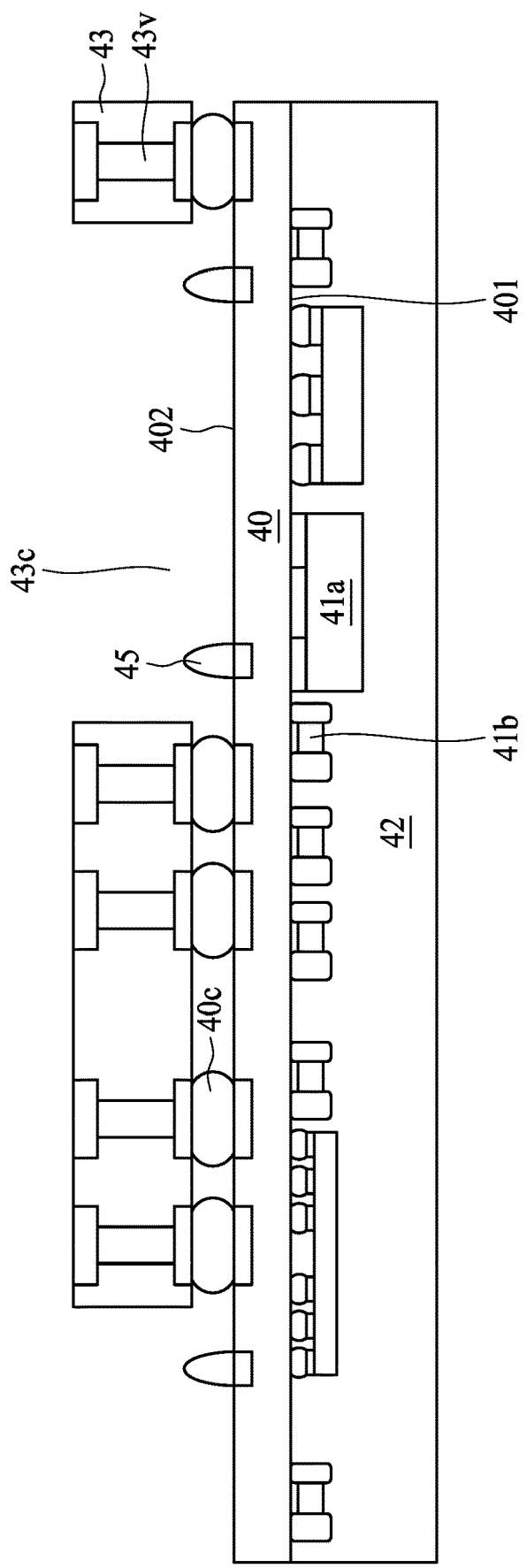
Figure 4E:
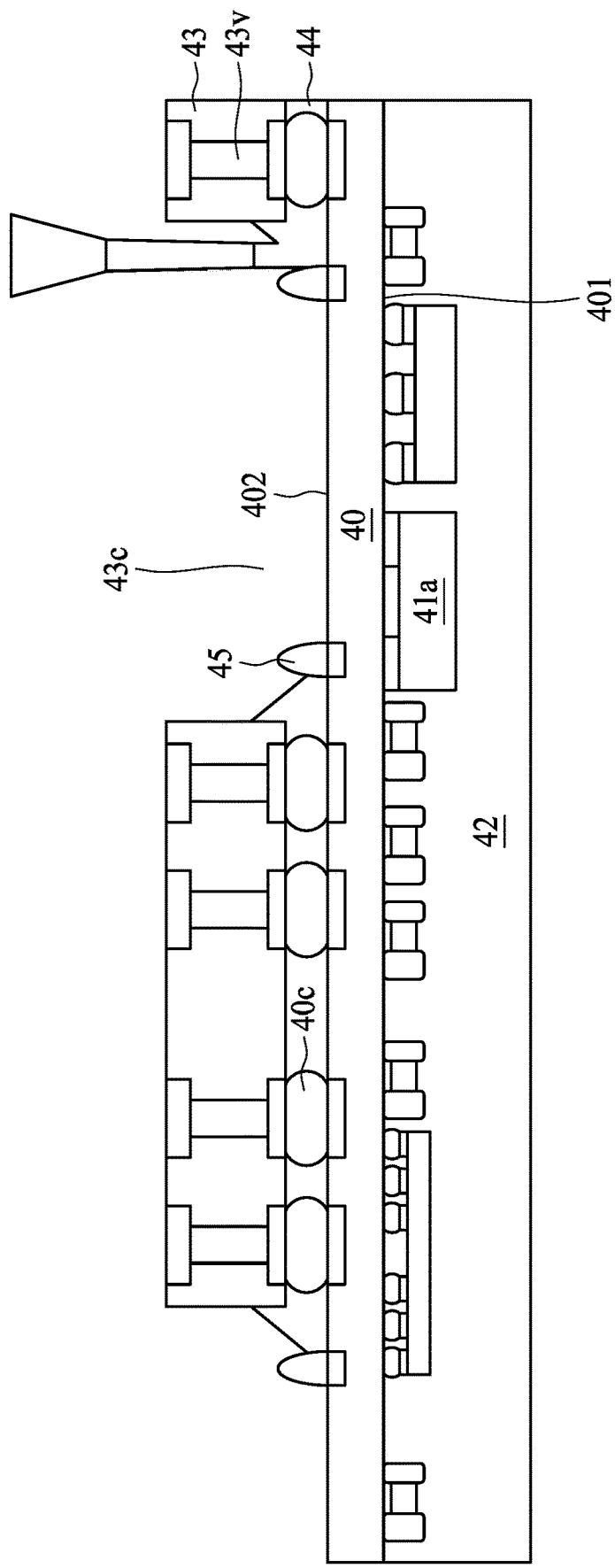
Figure 4E:
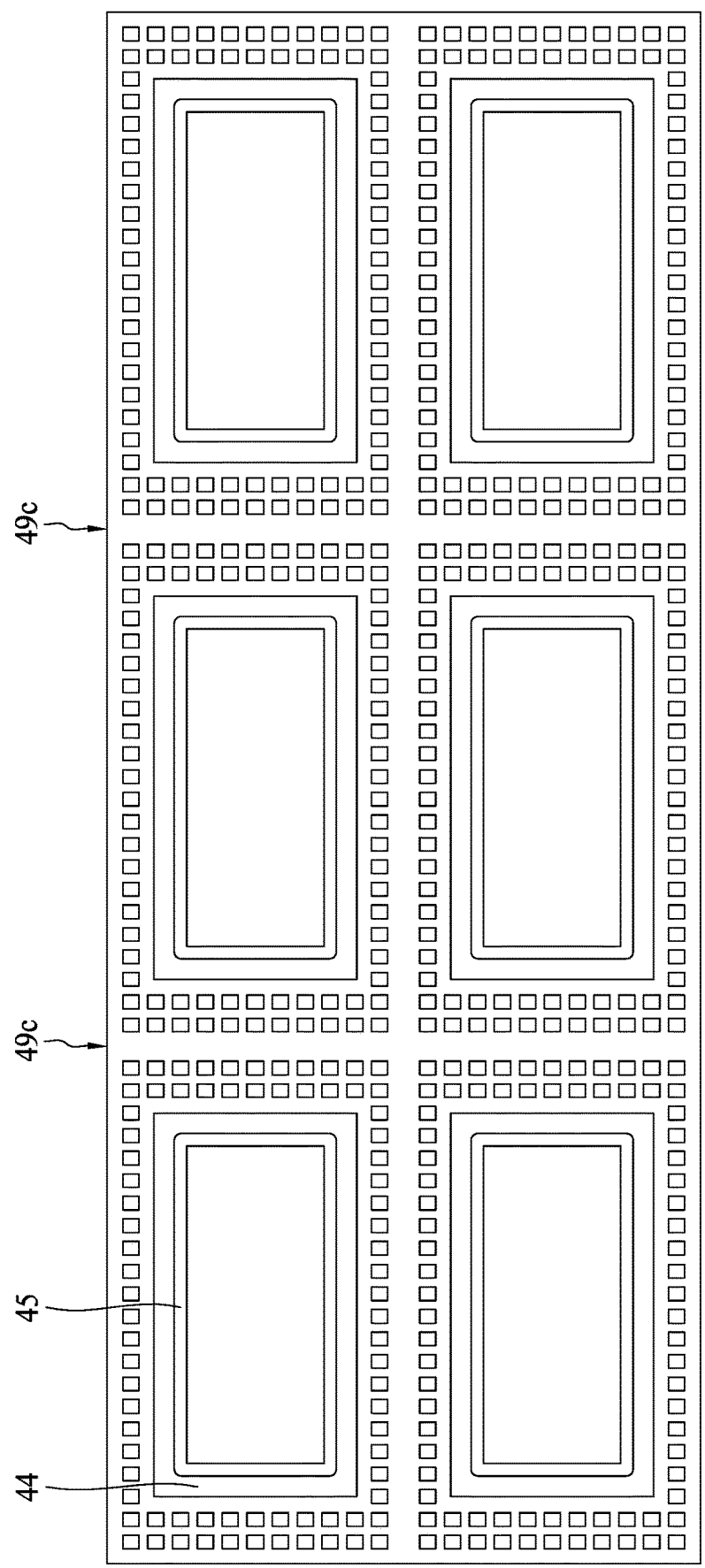

FIG. 4A, FIG. 4B, FIG. 4C, FIG. 4D, FIG. 4E, and FIG. 4F are cross-sectional views of a semiconductor structure at various stages of fabrication, and FIG. 4E' is a bottom view of such a semiconductor structure, in accordance with some embodiments of the present disclosure. Various figures have been simplified to better highlight aspects of the present disclosure.

Referring to FIG. 4A a substrate strip including multiple substrates 40 is provided, and the provision of the multiple substrates 40 allows multiple semiconductor package devices to be manufactured concurrently. The substrate 40 may include, for example, a printed circuit board, such as a paper-based copper foil laminate, a composite copper foil laminate, or a polymer-impregnated glass-fiber-based copper foil laminate.

An electronic component 41a and an electronic component 41b are formed or disposed on a top surface 401 of the substrate 40 and electrically connected to the substrate 40 by, for example, flip-chip, wire-bond or surface-mount-technology (SMT). Each of the electronic components 41a, 41b includes a plurality of semiconductor devices, such as, but not limited to, transistors, capacitors and resistors interconnected together by a die interconnection structure into functional circuits to thereby form an integrated circuit. A device side of the semiconductor die includes an active portion including integrated circuitry and interconnections.

A trace 10 and one or more pads 46 may be disposed on a bottom surface 402 of the substrate 40. The trace 10 may be disposed adjacent to a filling region of the bottom surface 402, and the one or more pads 46 may be disposed in the filling region of the bottom surface 402.

Referring to FIG. 4B, a package body 42 is formed on the top surface 401 of the substrate 40 and encapsulates a portion of the top surface 401 of the substrate 40 and the electronic components 41a and 41b. In some embodiments, the package body 42 includes, for example, organic materials (e.g., a molding compound, BT, a PI, PBO, a solder resist, an ABF, a PP or an epoxy-based material), inorganic materials (e.g., silicon, a glass, a ceramic or a quartz), liquid-film materials and/or dry-film materials, or a combination thereof. The package body 42 may be formed by a molding technique, such as transfer molding or compression molding.

Referring to FIG. 4C, the structure shown in FIG. 4B is flipped, and a solder paste is printed at predetermined locations to form solder balls 40c (e.g. on the one or more pads 46) and a barrier element 45 (e.g. on the trace 10). In some embodiments, the barrier element 45 and the trace 10 on which the barrier element 45 is disposed are the same as or similar to any of those shown in FIG. 2C through FIG. 2H depending on design specifications.

Referring to FIG. 4D, an interposer 43 is mounted on the bottom surface 402 of the substrate 40 and electrically connected to the substrate 40 through the solder balls 40c. The interposer 43 may include at least one through via 43v penetrating the interposer 43 for electrical connection. The interposer 43 may include, for example, a printed circuit board, such as a paper-based copper foil laminate, a composite copper foil laminate, or a polymer-impregnated glass-fiber-based copper foil laminate. The interposer 43 and the electrical contacts 40c may be arranged at or near a periphery of the bottom surface 402 of the substrate 40. In some embodiments, the interposer 43 defines a cavity 43c that exposes a portion of the bottom surface 402 of the substrate and the barrier element 45. A reflow process is then carried out.

Referring to FIG. 4E, an underfill 44 may be formed or disposed in a gap between the bottom surface 402 of the substrate 40 and the interposer 43 to cover the electrical contacts 40c. In some embodiments, the underfill 44 includes an epoxy resin, a molding compound (e.g., an epoxy molding compound or other molding compound), a polyimide, a phenolic compound or material, a material including a silicone dispersed therein, or a combination thereof. In some embodiments, the underfill 43 may be a CUF or a MUF depending on design specifications.

In some embodiments, the underfill 44 is injected or applied at a predetermined location (e.g., an injection region) on the bottom surface 402 of the substrate 40, and thus an amount of the underfill 44 at the injection region is more than that at another region. To avoid the bleeding out of the underfill 44, a height of the barrier element 45 on the injection region is greater than a height of the barrier element 45 on the other region. In some embodiments, a height of the underfill 44 adjacent to the injection portion is higher than a height of the underfill 44 adjacent to the other portion.

FIG. 4E' illustrates a bottom view of the operation for forming underfill 44 as shown in FIG. 4E in accordance with some embodiments of the present disclosure. As shown in FIG. 4E', the underfill 44 is injected or applied at the predetermined location (e.g., the injection region) on the bottom surface 402 of the substrate 40. The substrate 40 may define one or more cutting channels 49c.

Figure 4F:
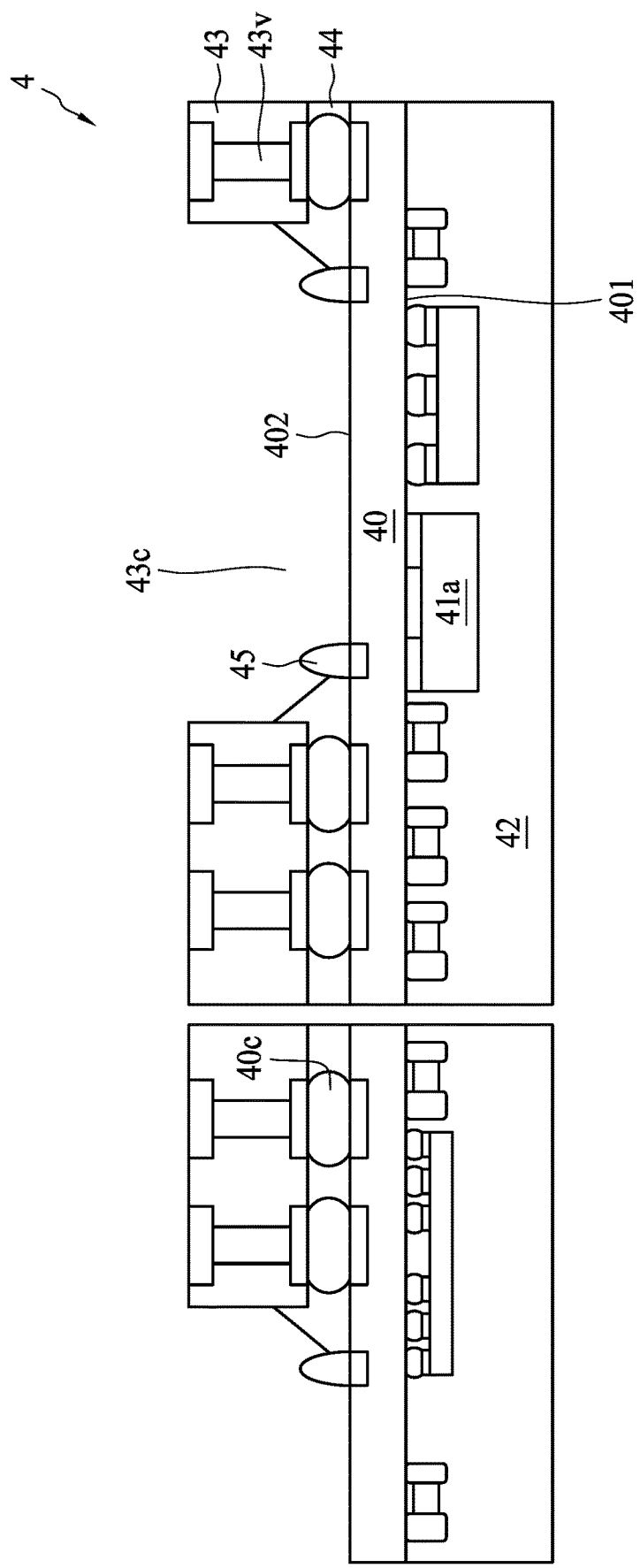
FIG. 4F and FIG. 5 illustrate a method of manufacturing a semiconductor package in accordance with some embodiments of the present disclosure.

Referring to FIG. 4F, singulation may be performed to separate out individual semiconductor package devices 4. That is, the singulation is performed through the interposer 43, the substrate strip including the substrates 40 and the package body 42. In some embodiments, the singulation may be performed along the cutting channel 49c shown in FIG. 4E'. The singulation may be performed, for example, by using a dicing saw, laser or other appropriate cutting technique. In some embodiments, the semiconductor package device 4 is the same as the semiconductor package device 2 shown in FIG. 2A.

Figure 5:
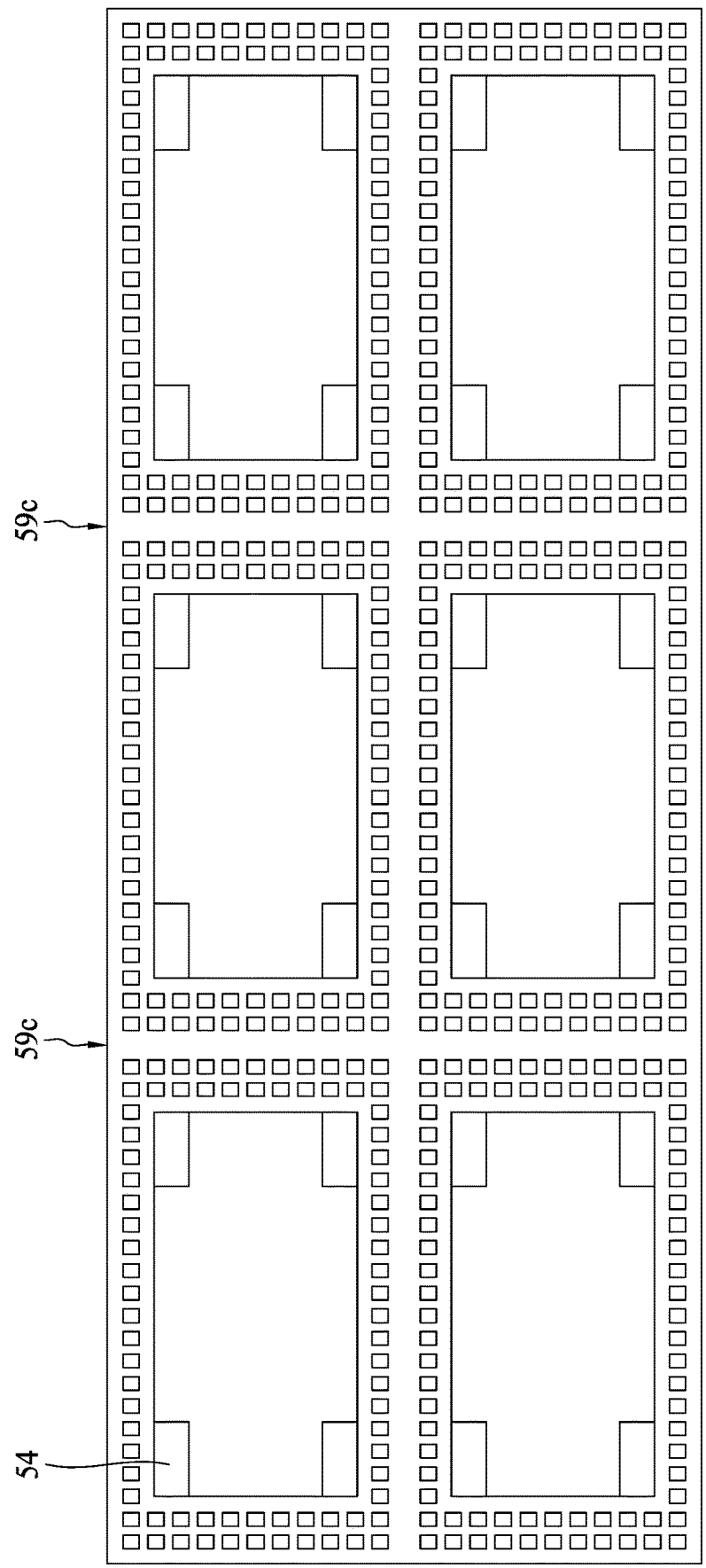

FIG. 5 illustrates a bottom view of the operation for forming underfill 24 as shown in FIG. 2F in accordance with some embodiments of the present disclosure. As shown in FIG. 5, an underfill 54 is injected or applied at a predetermined location (e.g., an injection region) on the bottom surface of the substrate. Then, singulation may be performed along a cutting channel 59c.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations do not limit the present disclosure. It can be clearly understood by those skilled in the art that various changes may be made, and equivalent components may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A semiconductor package device, comprising:
   a substrate having a first surface that comprises a filling region;
   a trace disposed adjacent to the first surface of the substrate and continuously surrounding the filling region of the first surface of the substrate;
   a structure disposed over the filling region and electrically connected to the substrate;
   a barrier element disposed on the trace; and
   an underfill disposed on the filling region.

2. The semiconductor package device of claim 1, wherein the trace comprises a first portion and a second portion, and a width of the first portion of the trace is greater than a width of the second portion of the trace.

3. The semiconductor package device of claim 2, wherein the first portion of the trace is adjacent to a portion of the filling region where the underfill is applied.

4. The semiconductor package device of claim 2, wherein a height of the barrier element on the first portion of the trace is greater than a height of the barrier element on the second portion of the trace.

5. The semiconductor package device of claim 4, wherein a height of the underfill adjacent to the first portion of the trace is greater than a height of the underfill adjacent to the second portion of the trace.

6. The semiconductor package device of claim 1, wherein the trace is ring-shaped.

7. The semiconductor package device of claim 1, wherein a contact angle of a material of the barrier element relative to a material of the underfill is equal to or greater than about 25 degrees.

8. The semiconductor package device of claim 1, wherein the structure defines a cavity exposing a portion of the barrier element, a portion of the first surface of the substrate and a portion of the underfill.

9. The semiconductor package device of claim 8, further comprising an electronic component disposed on a second surface of the substrate opposite to the first surface of the substrate.

10. The semiconductor package device of claim 1, wherein the structure comprises an interconnection penetrating the structure and electrically connected to the substrate.

11. A semiconductor package device, comprising:
    a substrate having a first surface that comprises a filling region and a non-filling region separated from the filling region;
    a trace disposed adjacent to the first surface and surrounding the filling region;
    a structure disposed over the substrate and electrically connected to the substrate;
    a barrier element disposed on the trace; and
    an underfill disposed on the filling region, wherein the barrier element protrudes beyond a surface of the structure facing the first surface of the substrate.

12. The semiconductor package device of claim 11, wherein the trace comprises a first portion exposed from the structure and a second portion covered by the structure, and wherein a width of the first portion is greater than a width of the second portion.

13. The semiconductor package device of claim 12, wherein a height of the barrier element on the first portion of the trace is greater than a height of the barrier element on the second portion of the trace.

14. The semiconductor package device of claim 13, wherein a height of the underfill adjacent to the barrier element on the first portion of the trace is greater than a height of the underfill adjacent to the barrier element on the second portion of the trace.

15. The semiconductor package device of claim 11, wherein the trace is ring-shaped.

16. The semiconductor package device of claim 11, wherein the structure defines a cavity exposing a portion of the barrier element, a portion of the first surface of the substrate and a portion of the underfill.

17. The semiconductor package device of claim 16, further comprising an electronic component disposed on a second surface opposite to the first surface of the substrate.

18. The semiconductor package device of claim 11, wherein the structure includes an interconnection penetrating the structure and electrically connected to the substrate.

19. The semiconductor package device of claim 11, wherein the trace comprises a plurality of sections, and each section is separated from another section.

20. The semiconductor package device of claim 19, wherein each section of the trace is separated from each other section of the trace.

21. A semiconductor package device, comprising:
    a substrate having a first surface that comprises a filling region;
    a trace disposed adjacent to the first surface of the substrate and surrounding the filling region of the first surface of the substrate;
    a structure disposed over the filling region and electrically connected to the substrate;
    a barrier element disposed on the trace; and
    an underfill disposed on the filling region;
    wherein the trace includes multiple sections, and each section is separated from at least one other section; and
    wherein the multiple sections together form a pattern surrounding the filling region of the first surface of the substrate.

22. The semiconductor package device of claim 21, wherein each of the multiple sections comprises a first portion and a second portion, and a width of the first portion is greater than a width of the second portion.

23. The semiconductor package device of claim 22, wherein the barrier element is disposed on the first portion and the second portion, and a height of the barrier element on the first portion is greater than a height of the barrier element on the second portion.

* * * * *